US012610477B2

(12) United States Patent
Tang

(10) Patent No.: US 12,610,477 B2
(45) Date of Patent: Apr. 21, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Chihshun Tang, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 590 days.

(21) Appl. No.: 17/290,720

(22) PCT Filed: Apr. 19, 2021

(86) PCT No.: PCT/CN2021/088069
    § 371 (c)(1),
    (2) Date: Mar. 11, 2024

(87) PCT Pub. No.: WO2022/205524
    PCT Pub. Date: Oct. 6, 2022

(65) Prior Publication Data
    US 2024/0260207 A1    Aug. 1, 2024

(30) Foreign Application Priority Data
    Mar. 29, 2021    (CN) .......................... 202110333788.8

(51) Int. Cl.
    *H05K 5/02*        (2006.01)

(52) U.S. Cl.
    CPC ..................................... *H05K 5/02* (2013.01)

(58) Field of Classification Search
    CPC ....... H05K 5/0017; H05K 5/0217; H05K 5/02
    USPC ......................................... 361/807, 809, 810
    See application file for complete search history.

(56) References Cited

U.S. PATENT DOCUMENTS

| | | | | |
|---|---|---|---|---|
| 2015/0049428 A1* | 2/2015 | Lee | ........................ | G06F 1/1652 |
| | | | | 361/679.27 |
| 2016/0357052 A1* | 12/2016 | Kim | ........................ | H10K 59/87 |
| 2017/0303414 A1 | 10/2017 | Chu | | |
| 2019/0204872 A1* | 7/2019 | Lee | ........................ | G06F 1/1641 |

(Continued)

FOREIGN PATENT DOCUMENTS

| | | | | |
|---|---|---|---|---|
| CN | 107195252 A | * | 9/2017 | ............. G09F 9/301 |
| CN | 109118964 A | | 1/2019 | |
| CN | 109377887 A | | 2/2019 | |

(Continued)

*Primary Examiner* — Hung S. Bui
(74) *Attorney, Agent, or Firm* — PV IP PC; Peter Stecher; Wei Te Chung

(57) ABSTRACT

The present disclosure discloses a display panel and a display device. The display panel includes a first support portion which supports a side of a first flexible display portion, and a second support portion in a bent state which supports a side of a second bending portion, wherein a stress buffering capacity of the first support portion is less than a stress buffering capacity of the second support portion, so as to improve impact resistance of the second bending portion through the second support portion, and reduce a risk of failure of the display panel due to impact on the second bending portion.

18 Claims, 8 Drawing Sheets

(56)     References Cited

U.S. PATENT DOCUMENTS

| 2020/0245501 | A1 * | 7/2020 | Wu | ............................ | F28F 3/02 |
| 2020/0266367 | A1 * | 8/2020 | Wang | ..................... | H10K 71/40 |

FOREIGN PATENT DOCUMENTS

| CN | 110853525 | A | * | 2/2020 | ............. | G09F 9/301 |
| CN | 111294434 | A | | 6/2020 | | |
| CN | 211928943 | U | | 11/2020 | | |
| CN | 112086021 | A | | 12/2020 | | |
| CN | 112164712 | A | | 1/2021 | | |
| KR | 20190053691 | A | * | 5/2019 | ............. | G09F 9/301 |

* cited by examiner

DISPLAY PANEL AND DISPLAY DEVICE

RELATED APPLICATIONS

This application is a Notional Phase of PCT Patent Application No. PCT/CN2021/088069 having international filing date of Apr. 19, 2021, which claims the benefit of priority of Chinese Patent Application Nos. 202110333788.8 filed on Mar. 29, 2021. The contents of the above applications are all incorporated by reference as if fully set forth herein in their entirety.

BACKGROUND OF INVENTION

Field of Invention

The present disclosure relates to the field of display technology, and in particular to a display panel and a display device.

Description of Prior Art

In a display device, an outer bending design is adopted to bend a portion of a display screen of a display panel to a bottom of the display panel, or to a partial area at the bottom of the display panel, which can reduce a size of a lower frame of the display device. However, since the display screen that is kept in a bent state is at an outermost bottom of the display device, and in order to meet requirements of bending performance, a supporting steel plate is provided on a back of the display panel. Therefore, in an event of drop, impact, or the like, the display screen at the outermost bottom receives greater impact, and poor impact resistance of the supporting steel plate exacerbates a risk of failure of the display screen on the outermost bottom of the display device due to impact, which can cause serious display failure problem.

SUMMARY OF INVENTION

Embodiments of the present disclosure provide a display panel and a display device, which can reduce the risk of display failure of the display panel caused by impact during use of the display panel.

Problem Solution

Technical Solution

An embodiment of the present disclosure provides a display panel, which includes a panel body and a support member. The panel body includes a first flexible display portion and a second bending portion located at an end of the first flexible display portion; and the support member includes a support layer, wherein the support layer includes a first support portion and a second support portion, the first support portion supports a side of the first flexible display portion, and the second support portion is in a bent state and supports a side of the second bending portion, wherein a stress buffering capacity of the first support portion is less than a stress buffering capacity of the second support portion.

Optionally, in some embodiments of the present disclosure, an elastic modulus of the first support portion is greater than an elastic modulus of the second support portion.

Optionally, in some embodiments of the present disclosure, a material of the first support portion includes a stainless steel plate, and a material of the second support portion includes foam.

Optionally, in some embodiments of the present disclosure, the first support portion and the second support portion are spaced apart from each other.

Optionally, in some embodiments of the present disclosure, the first support portion and the second support portion are connected to each other.

Optionally, in some embodiments of the present disclosure, the support member is provided with an opening penetrating through the first support portion, and the second support portion is disposed in the opening.

Optionally, in some embodiments of the present disclosure, a thickness of the second support portion is greater than or equal to a thickness of the first support portion.

Optionally, in some embodiments of the present disclosure, the thickness of the second support portion is 1 to 1.2 times the thickness of the first support portion.

Optionally, in some embodiments of the present disclosure, the support member further includes a connecting layer between the support layer and the panel body.

Optionally, in some embodiments of the present disclosure, the support member is provided with an opening penetrating through the support layer and the connecting layer, and the second support portion is disposed in the opening.

Optionally, in some embodiments of the present disclosure, the connecting layer includes a first connecting layer and a second connecting layer, the first connecting layer is located between the second connecting layer and the support layer, and the second connecting layer is located between the first connecting layer and the panel body.

Optionally, in some embodiments of the present disclosure, a thickness of the second support portion is 1 to 1.2 times a sum of a thickness of the first support portion and a thickness of the connecting layer.

Optionally, in some embodiments of the present disclosure, when the first flexible display portion is in a bent state, the first flexible display portion includes a curved portion, and a bending direction of the curved portion is different from a bending direction of the second bending portion.

Optionally, in some embodiments of the present disclosure, the panel body further includes a third display portion, the second bending portion is located between the first flexible display portion and the third display portion, the third display portion is opposite to the first flexible display portion, and the first support portion supports the side of the first flexible display portion and a side of the third display portion close to the first flexible display portion.

Optionally, in some embodiments of the present disclosure, opposite ends of the second support portion supports the side of the first flexible display portion and the side of the third display portion, respectively.

Optionally, in some embodiments of the present disclosure, the first support portion includes a plurality of first hollow portions and the second support portion comprises a plurality of second hollow portions, and in a unit area, a density of hollow holes of the first hollow portions and a density of hollow holes of the second hollow portions are different.

Optionally, in some embodiments of the present disclosure, the support layer further includes a filling part disposed in the second hollow portion, and a hardness of the second support portion is less than a hardness of the filling part.

An embodiment of the present disclosure provides a display device including any of the above-mentioned display panels.

Beneficial Effects of Invention

Beneficial Effects

Compared with the prior art, in the display panel and the display device provided by the embodiments of the present disclosure, the display panel includes a panel body and a support member. The panel body includes a first flexible display portion and a second bending portion located at an end of the first flexible display portion; the support member includes a support layer, and the support layer includes a first support portion and a second support portion, the first support portion supports a side of the first flexible display part, and the second support portion is in a bent state and supports a side of the second bending portion, wherein the stress buffering capacity of the first support portion is less than the stress buffering capacity of the second support portion, so as to improve the impact resistance of the second bending portion through the second support portion and reduce a risk of failure of the display panel due to the impact of the second bending portion during use of the display panel.

DETAILED DESCRIPTION OF PREFERRED EMBODIMENTS

In order to make the objects, technical solutions, and effects of the present disclosure clear and definite, the following further describes the present disclosure in detail with reference to the accompanying drawings and examples. It should be understood that the specific embodiments described here are only used to explain the present disclosure, not to limit the present disclosure.

Figure 1A:
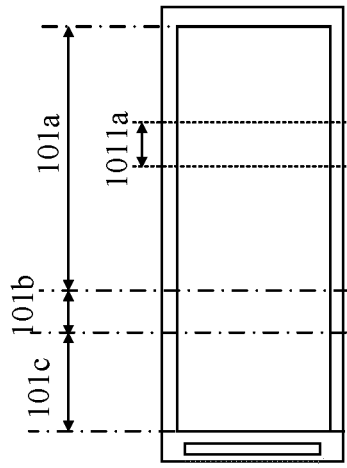
FIG. 1A to FIG. 1C are structural schematic diagrams of display panels provided by embodiments of the present disclosure.
Figure 1A:
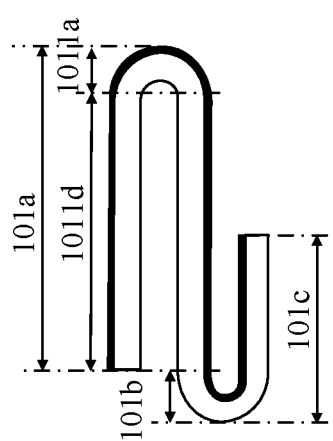
Figure 1B:
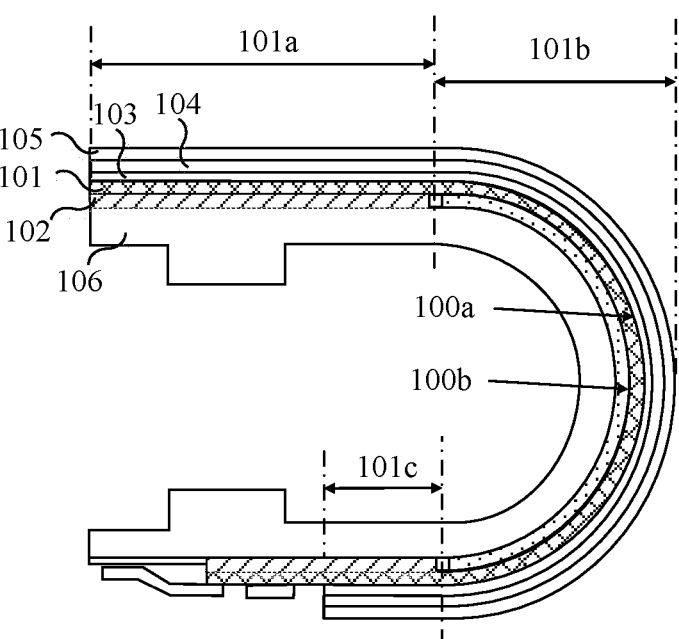
Figure 1C:
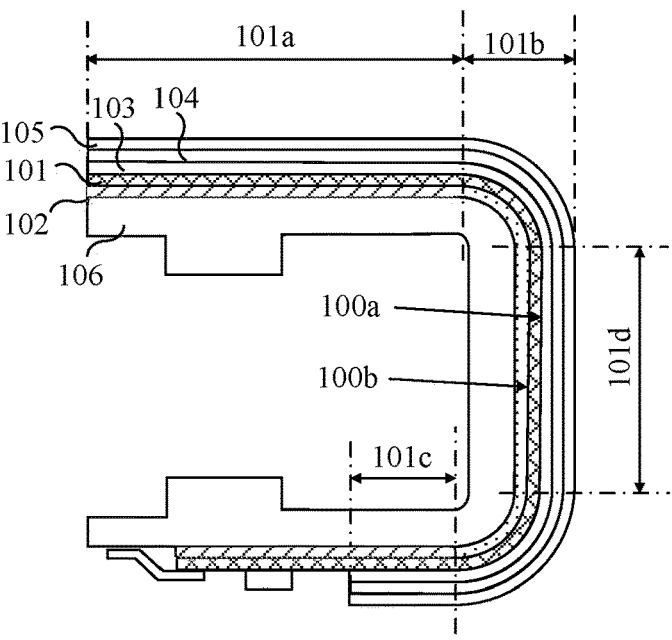
Figure 2A:
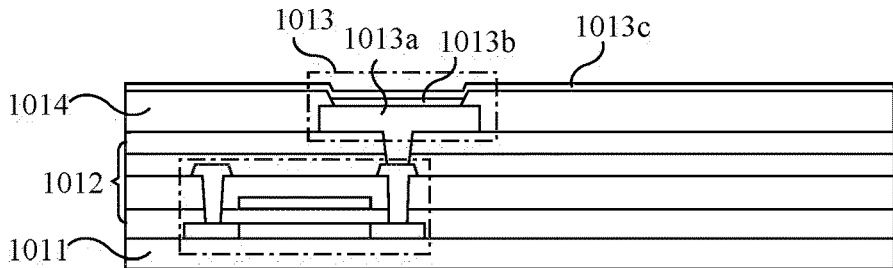
FIG. 2A to FIG. 2B are structural schematic diagrams of panel bodies provided by embodiments of the present disclosure.
Figure 2B:
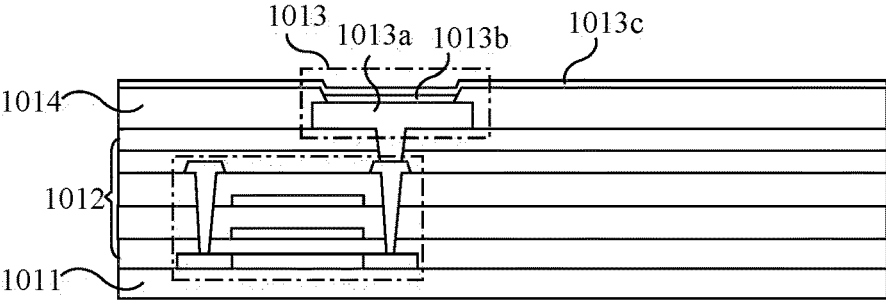

Refer to FIG. 1A to FIG. 1C, which are structural schematic diagrams of display panels provided by embodiments of the present disclosure. FIG. 2A to FIG. 2B are structural schematic diagrams of panel bodies provided by embodiments of the present disclosure. FIG. 3A to FIG. 3D are structural schematic diagrams of support structures provided by embodiments of the present disclosure. An embodiment of the present disclosure provides a display panel. Optionally, the display panel includes a self-luminous display panel, a quantum dot display panel, and the like.

The display panel includes a panel body 101. Further, referring to FIG. 2A to FIG. 2B, the display panel is a self-luminous display panel, and the panel body 101 includes a substrate 1011, a drive array layer 1012, and a light-emitting device 1013 on the substrate 1011. The drive array layer 1012 includes a plurality of transistors, and the transistors include field effect transistors. Further, the transistor includes a thin film transistor. The transistors include oxide transistors and silicon transistors. The light-emitting device 1013 includes organic light-emitting diodes, sub-millimeter light-emitting diodes, micro light-emitting diodes, and the like. The light-emitting device 1013 includes an anode 1013a, a cathode 1013c, and a light-emitting layer 1013b. The light-emitting layer 1013b is located between the anode 1013a and the cathode 1013c and is located in a pixel definition area of a pixel definition layer 1014.

Optionally, the display panel may further include a passive light-emitting display panel. Further, the panel body 101 may include devices such as liquid crystals, drive arrays, and so on.

Still referring to FIG. 1A to FIG. 1C, the display panel further includes a support member 102 located on one side of the panel body 101, and the support member 102 is configured to support the panel body 101. Specifically, the panel body 101 includes a first surface 100a and a second surface 100b opposite to each other. If the first surface 100a is a display side of the display panel, the support member 102 and the second surface 100b are adjacent to each other.

The panel body 101 includes a first flexible display portion 101a and a second bending portion 101b located at an end of the first flexible display portion 101a. Optionally, the second bending portion 101b has a fixed curvature, so that the second bending portion 101b is kept in a static bending state. Alternatively, the second bending portion 101b has a variable curvature, so that the second bending portion 101b can realize dynamic bending. Optionally, in a top view, the second bending portion 101b is located on the bottom side of the display panel, and the display panel can realize display on the second bending portion 101b.

Still referring to FIG. 3A to FIG. 3D, the support member 102 includes a support layer 1021, and the support layer 1021 includes a first support portion 1021a and a second support portion 1021b. The first support portion 1021a supports a side of the flexible display portion 101a, and the second support portion 1021b is in a bent state and supports a side of the second bending portion 101b.

The stress buffering capacity of the first support portion 1021a is less than the stress buffering capacity of the second support portion 1021b, so as to support the second bending portion 101b through the second support portion 1021b while improving the impact resistance of the display panel at the second bending portion 101b, thereby preventing the display failure of the display panel when the second bending portion 101b is subjected to an impact, collision, or the like.

Further, the elastic modulus of the first support portion 1021a is greater than the elastic modulus of the second support portion 1021b, so that the second support portion 1021b undergoes a certain elastic deformation when receiving an impact force, thereby reducing the impact of the impact force on the display panel, and after the impact force disappears, the deformed portion can be restored to the original state, maintaining the support for the second bending portion 101b.

Optionally, the support material of the first support portion 1021a includes a stainless steel plate. The second bending portion 101b maintains a static bending state, and the material of the second support portion 1021b includes a material with buffering properties, such as foam.

Optionally, the hardness of the material is distinguished by 25% compression load (i.e., the resilience CFD when the thickness deformation rate is 25%). The larger the value, the harder the material, and the smaller the value, the softer the material. The material of the second support portion 1021b has a compression load at 25% in the range of 0.1 MPa to 1 MPa. Further, the material of the second support portion 1021b has a compression load at 25% in the range of 0.5 MPa to 1 MPa.

Optionally, the first support portion 1021a and the second support portion 1021b may be spaced apart or connected to each other.

Figure 3A:
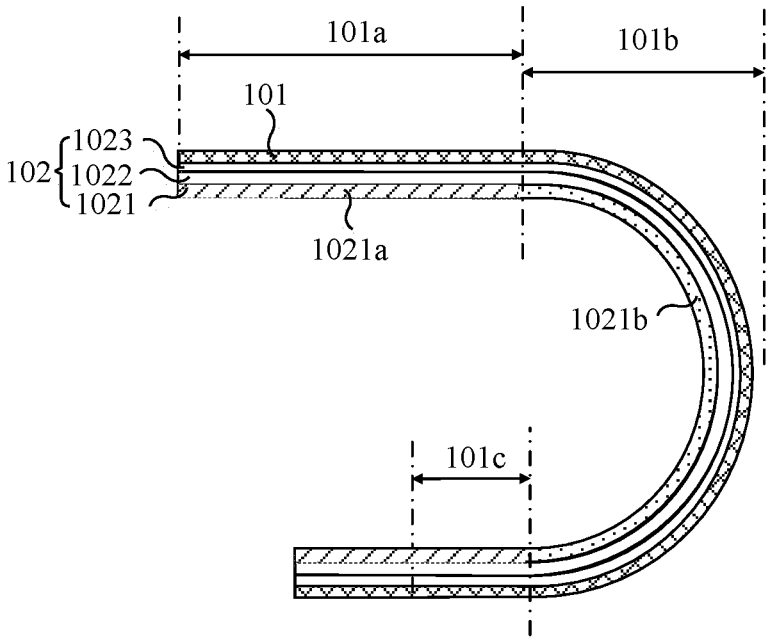
FIG. 3A to FIG. 3D are structural schematic diagrams of support members provided by embodiments of the present disclosure.
Figure 3B:
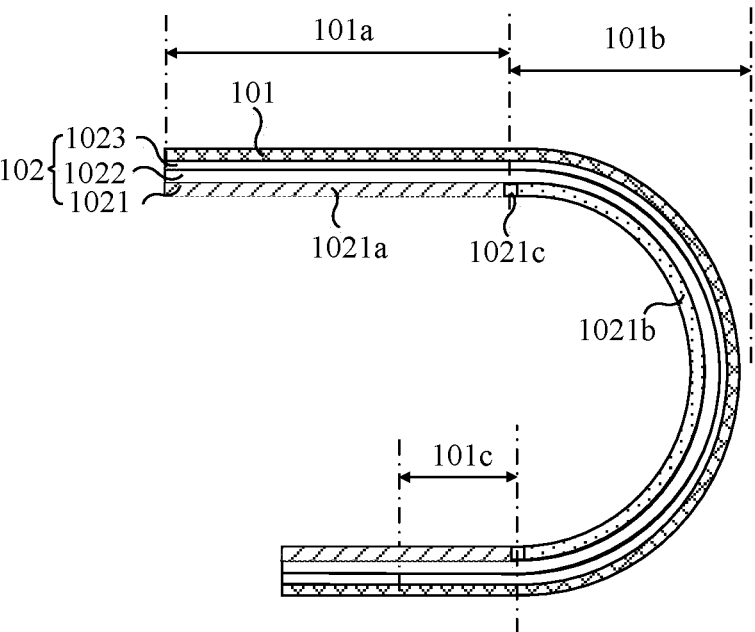
Figure 3C:
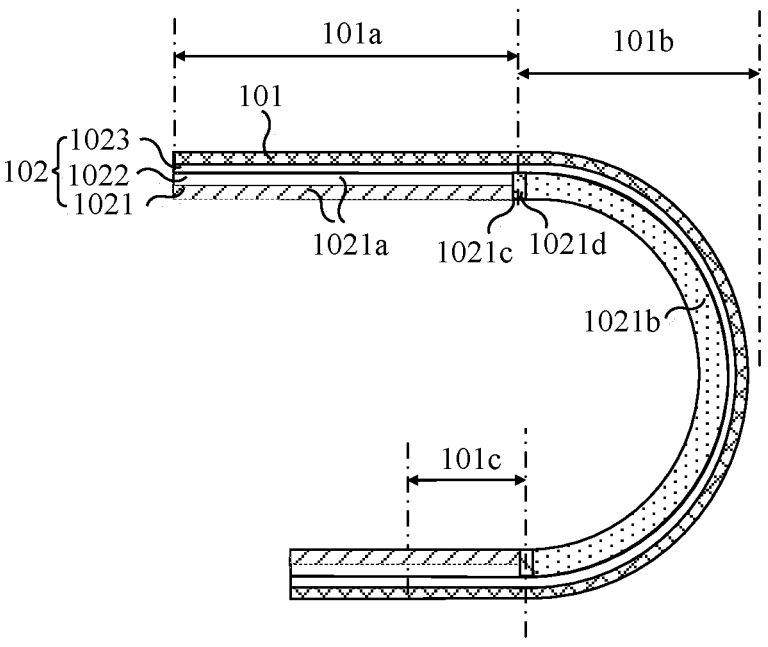
Figure 3D:
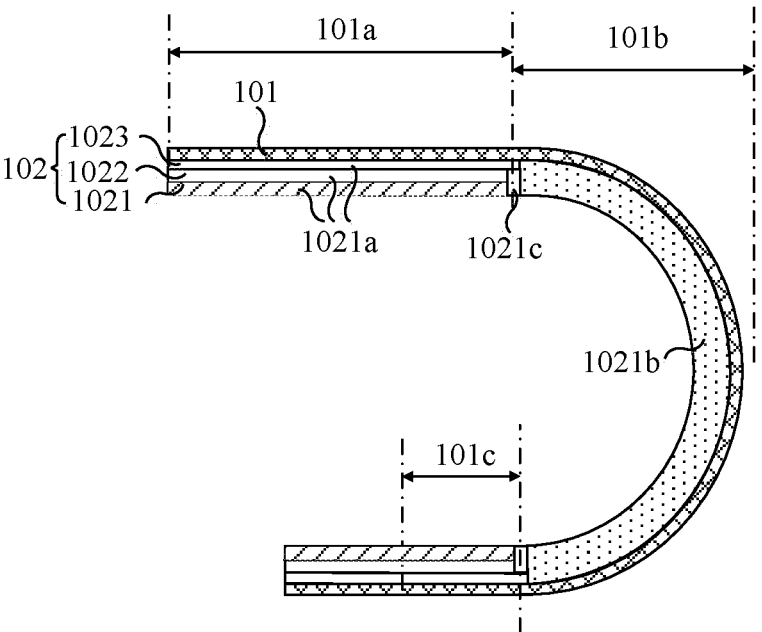

Specifically, still referring to FIG. 3B to FIG. 3D, the support layer 1021 further includes a spacer portion 1021c between the first support portion 1021a and the second support portion 1021b to prevent the display panel from being impacted by the impact force transmitted from the second support portion 1021b to the first support portion 1021a, which may adversely affect the first flexible display portion 101a.

In the manufacturing process, the first support portion 1021a and the second support portion 1021b can be prepared in a stepwise manner, wherein the first support portion 1021a is prepared on the side of the first flexible display portion 101a, and the second support portion 1021b is prepared on the side of the second bending portion 101b. Therefore, when preparing the first support portion 1021a and the second support portion 1021b, there will be a tolerance of preparation accuracy (that is, there is a certain positional deviation when the first support portion 1021a is prepared on the side of the first flexible display portion 101a, and/or when the second support portion 1021b is prepared on the side of the second bending portion 101b), resulting in the problem of mutual interference between the first support portion 1021a and the second support portion 1021b. By disposing the spacer portion 1021c between the first support portion 1021a and the second support portion 1021b, the display panel can eliminate the problem of mutual interference between the first support portion 1021a and the second support portion 1021b caused by the tolerance of preparation accuracy.

Specifically, the support layer 1021 further includes a connecting portion 1021d located between the first support portion 1021a and the second support portion 1021b, and the connecting portion 1021d is located in the spacer portion 1021c, so as to fully support the panel body 101 by the first support portion 1021, the second support portion 1021b, and the connecting portion 1021d, as shown in FIG. 3C. Further, the material of the connecting portion 1021d includes a foam material, a pressure sensitive adhesive, an optical adhesive, and/or the like.

Still referring to FIG. 1A to FIG. 1C, when the first flexible display portion 101a is in a bent state, the first flexible display portion 101a further includes a curved portion 1011a. Optionally, the curved portion 1011a has a fixed curvature, so that the curved portion 1011a is kept in a static bending state; or the curved portion 1011a has a variable curvature, so that the curved portion 1011a can achieve dynamic bending.

Optionally, the bending direction of the curved portion 1011a is different from the bending direction of the second bending portion 101b. The curved portion 1011a may be directly adjacent to the second bending portion 101b, or the first flexible display portion 101a may further include an uncurved portion 1011d between the curved portion 1011a and the second bending portion 101b.

Figure 4:
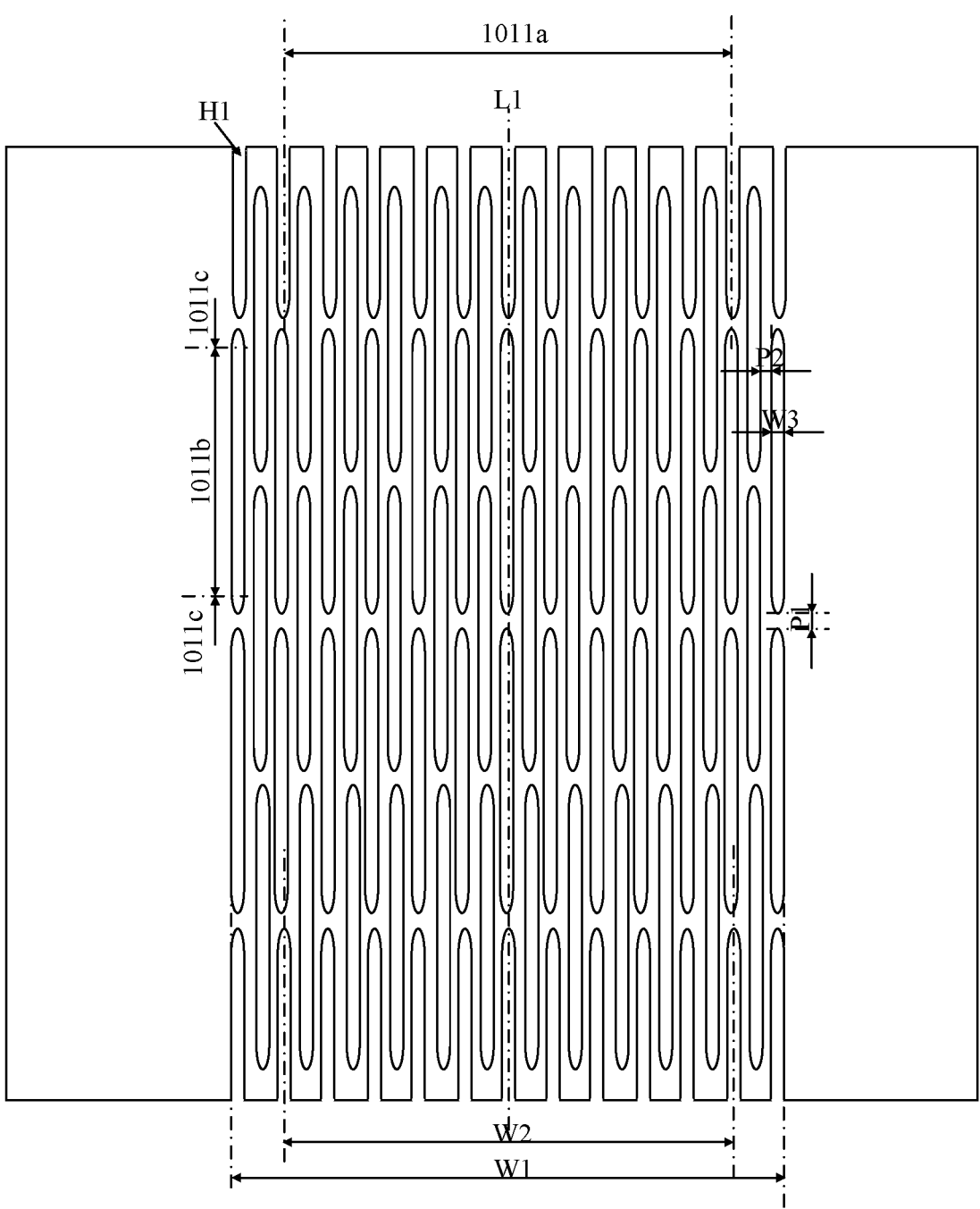
FIG. 4 is a structural schematic diagram of a first hollow portion provided by an embodiment of the present disclosure.

Optionally, FIG. 4 shows a schematic structural schematic diagram of a first hollow portion provided by an embodiment of the present disclosure. Referring to FIG. 1A, FIG. 3A to FIG. 3C, and FIG. 4, the first support portion 1021a includes a plurality of first hollow portions H1, the plurality of the first hollow portions H1 are arranged corresponding to the curved portion 1011a, so that the first support portion 1021a supports the curved portion 1011a while ensuring that the curved portion 1011a has a certain degree of bending performance.

Further, in a top view, each end of each of the first hollow portions H1 includes a rounded design to prevent the end of the first hollow portion H1 from cracks at a right angle due to bending stress when the end of the first hollow portion H1 is designed as a right angle. Specifically, each of the first hollow portions H1 includes a first middle portion 1011b and second end portions 1011c located at opposite sides of the middle portion 1011b. In a top view, the second end portions 1011c are arc-shaped, wave-shaped, and so on. Optionally, in a top view, the middle portion 1011b has a linear shape, a wave shape, or the like.

Further, each of the first hollow portions H1 has a first length direction and a first width direction intersecting the first length direction, and there is a first pitch P1 between adjacent ones of the first hollow portions H1 in the first length direction, and there is a second pitch P2 between adjacent ones of the first hollow portions H1 in the first width direction. The first length direction is parallel to the curved center line L1 of the curved portion 1011a. The first pitch P1 may be greater than or equal to 0.1 mm, and the second pitch P2 may be greater than or equal to 0.1 mm and less than or equal to 5 mm, so that the first support portion 1021a can realize both the support performance for the curved portion 1011a and the bending performance of the curved portion 1011a. Further, the first pitch P1 may be greater than or equal to 0.2 mm.

Further, in a top view, when the curved portion 1011a is in a straight state, the plurality of first hollow portions H1 have a first width W1 in the first width direction, and the curved portion 1011a has a second width W2 in the first width direction. The first width W1 is greater than or equal to the second width W2, so as to reduce the impact of the bending stress on the boundary between the curved portion 1011a and portions adjacent to the ends of the curved portion 1011a when the curved portion 1011a is bent.

Optionally, in a top view, the plurality of first hollow portions H1 may be arranged flush or staggered with each other. The flush arrangement includes a case that the plurality of the first hollow portions H1 are arranged flush with each other in the first length direction and/or arranged flush with each other in the first width direction. The staggered arrangement includes a case that the plurality of the first hollow portions H1 are staggered with each other in the first length direction, and/or staggered with each other in the first width direction.

Optionally, in a top view, each of the first hollow portions H1 has a third width W3 in the first width direction, and the third widths W3 of the plurality of the first hollow portions H1 may be the same or different. Further, the third width W3 of the plurality of first hollow portions H1 gradually decreases as the first hollow portions H1 move away from the curved center line L1. Further, among the plurality of first hollow portions H1, the third width W3 of the first hollow portion H1 corresponding the boundary between the curved portion 1011a of the first flexible display portion 101a and the portions adjacent to the curved portion 1011a are less than or equal to the third width W3 of the first hollow portions H1 corresponding to the curved center line L1.

Referring to FIG. 5A to FIG. 5F, which are structural schematic diagrams of the second hollow portions provided by embodiments of the present disclosure, the second support portion 1021b includes a plurality of second hollow portions H2. The plurality of second hollow portions H2 are squeezed when subjected to an impact, causing deformation of the second support portion 1021b, thereby consuming impact energy, which is beneficial to further improving the stress buffering ability of the second support portion 1021b. Further, in a unit area, the density of the hollow holes of the first hollow portion H1 and the density of the hollow holes of the second hollow portion H2 are different or the same.

Optionally, the support layer 1021 further includes a filling part 1021e located in the second hollow portion H2, and the hardness of the filling part 1021e is greater than or equal to the hardness of the second support portion 1021b, so as to absorb impact stress through the second support portion 1021b. The filling part 1021e is used to reduce the probability of local deformation of the display panel at the second bending portion 101b, thereby elevating the support performance of the second support portion 1021b to the second bending portion 101b while improving the impact resistance of the second bending portion 101b.

Optionally, the material of the filling part 1021e has a compression load at 25% in the range of 0.1 MPa to 1 MPa. Further, the material of the second support portion 1021b has a compression load at 25% in the range of 0.2 MPa or less and the material of the filling part 1021e has a compression load at 25% in the range of 0.5 MPa to 1 MPa.

Optionally, when the second bending portion 101b is in a straight state in a top view, the shape of each of the plurality of second hollow portions H2 includes a circle, a rounded rectangle, an ellipse, an arc, a wave, or the like. Further, in a top view, the shape of the second hollow portion H2 is circular, the filling part 1021e located in the second hollow portion H2 is also circular, and an aperture of the second hollow portion is larger than or equal to 0.8 mm and less than or equal to 2 mm.

Optionally, when the second bending portion 101b is in a straight state, each of the second hollow portions H2 has a second length direction x2 and a second width direction y2 intersecting the second length direction x2. The second width direction y2 is parallel to the curved center line L2 of the second bending portion 101b, and the distance P3 between adjacent ones of the second hollow portions H2 along the second width direction y2 is greater than or equal to 1mm and less than or equal to 3 mm, and the distance P4 between adjacent ones of along the second length direction x2 is greater than or equal to 1 mm and less than or equal to 3 mm, so as to prevent arrangement density of the second hollow portions H2 in the second support portion 1021b from being too dense or too sparse, which affects the impact resistance of the second support portion 1021b or the resistance performance against local deformation of the filling part 1021e.

Figure 5A:
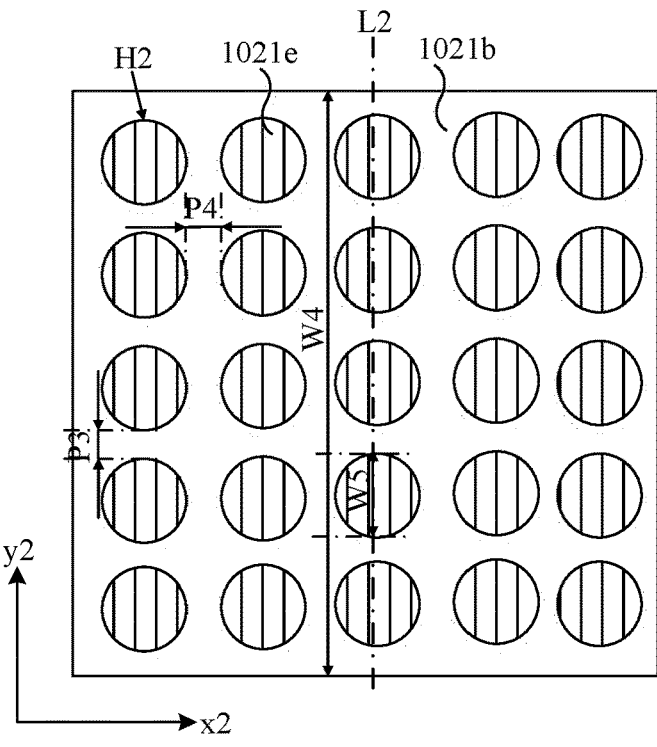
FIG. 5A to FIG. 5F are structural schematic diagrams of second hollow portions provided by embodiments of the present disclosure.
Figure 5B:
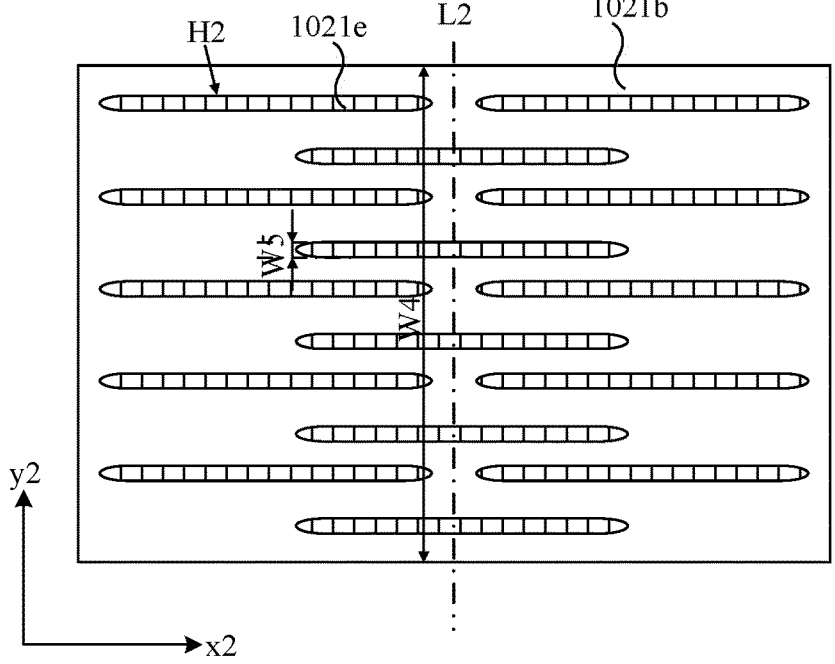

Further, when the second bending portion 101b is in a straight state, in a direction extending of the curved center line L2, the second bending portion 101b has a fourth width W4. In a top view, each of the second hollow portions H2 that overlaps the curved center line L2 has a fifth width W5 along the second width direction y2. The fourth width W4 is greater than the fifth width W5, as shown in FIG. 5A to FIG. 5B. As a result, when the display panel is impacted or collided, the synergy of the filling part 1021e and the second support portion 1021b reduces the impact caused by the impact force on the display panel, so that the influence of the impact force on the display panel can be further reduced, as compared with the case where the impact force only acts on the filling part 1021e when the display panel is impacted.

Figure 5C:
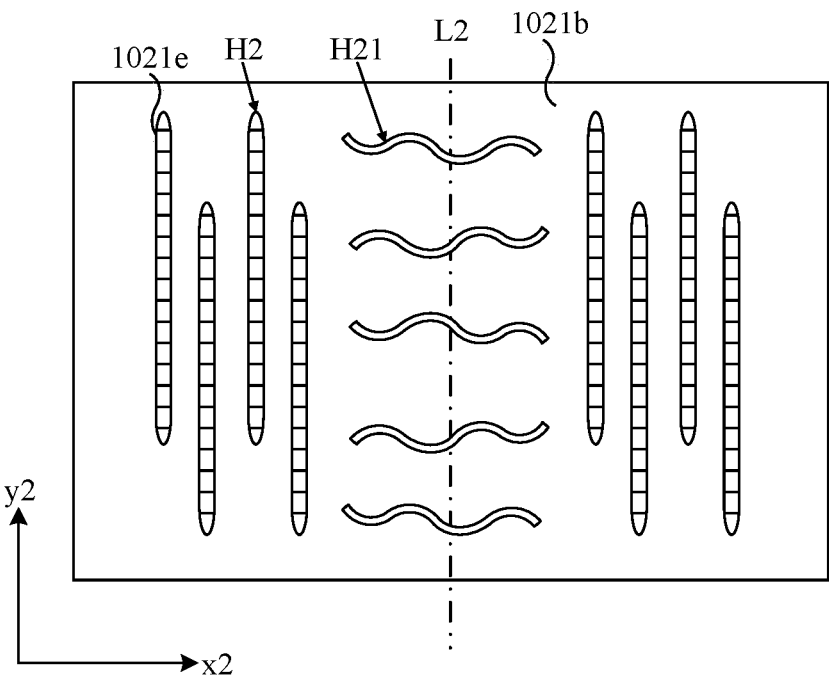

Optionally, in a top view, the shapes of the plurality of second hollow portions H2 are different. Further, the extending directions of the plurality of second hollow portions H2 are different or the same. Further, the one of the second hollow portions H2 away from the curved center line L2 extends along the second width direction y2, as shown in FIG. 5C, so that when the curved portion 101b is in a bent state after being bent along the curved center line L2, the degree of curvature of the surface of the filling part 1021e located in each of the second hollow portions H2 far from the curved center line L2 is relatively small, which reduces the impact of bending stress on the filling part 1021e located in each of the second hollow portions H2 away from the curved center line L2.

Optionally, the plurality of second hollow portions H2 close to the curved center line L2 are wave-shaped and extend along the second length direction x2 to increase the contact area between the second hollow portion H2 and the filling part 1021e located in each of the second hollow portions H21, thereby reducing the impact of bending stress on the filling part 1021e located in each of the second hollow portions H21, and reducing the risk of peeling between the filling part 1021e located in each of the second hollow portions H21 and the second support portion 1021b.

Figure 5D:
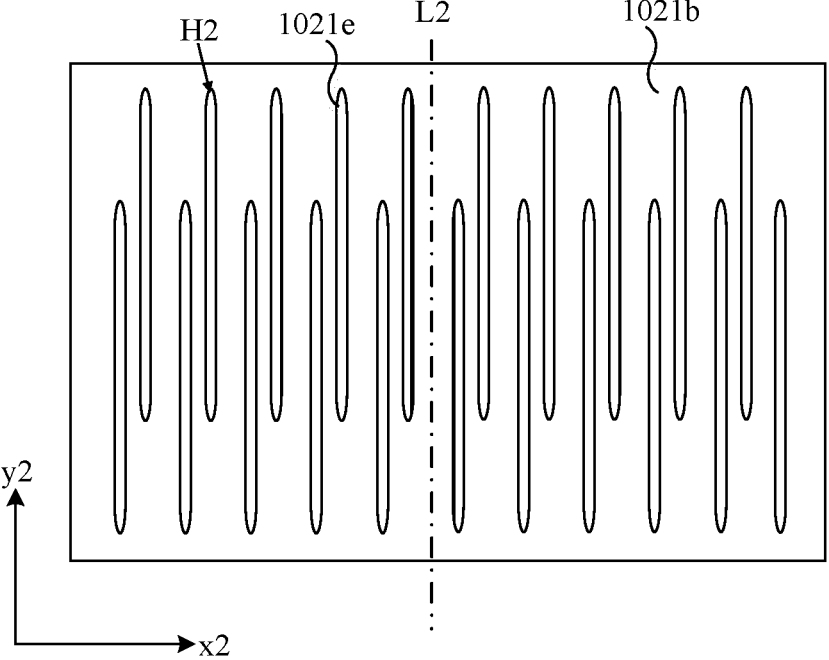

Further, the plurality of the second hollow portions H2 are respectively located on opposite sides of the curved center line L2, as shown in FIG. 5D, so as to prevent the peeling problem between the filling part 1021e and the second support portion 1021b caused by different bending stresses on the filling part 1021e and the second support portion 1021b when the second bending portion 101b is in a bending state.

Figure 5E:
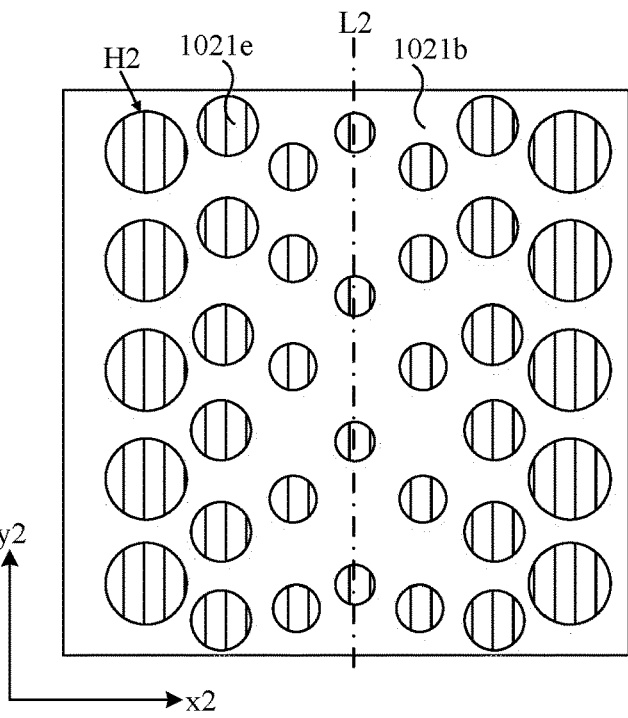

Optionally, the shapes and sizes of each of the first hollow portions H1 and each of the second hollow portions H2 may be the same or different. Optionally, the plurality of second hollow portions H2 may be evenly distributed or arranged according to a specific rule. For example, the arrangement density of the plurality of second hollow portions H2 on the second support portion 1021b gradually increases along a direction away from the curved center line L2, as shown in FIG. 5E. As such, the position of the display panel corresponding to the curved center line L2 has better impact resistance than the portion of the display panel away from the curved center line L2, and thereby the portion of the display panel that is greatly affected by the impact force can effectively absorb impact force and reduce the influence of impact stress on the display panel.

Optionally, the sizes of the plurality of second hollow portions H2 may be the same or different. For example, the sizes of the plurality of second hollow portions H2 gradually increase in a direction away from the curved center line L2, as shown in FIG. 5E. As such, the impact resistance of the second support portion 1021b at the portion of the display panel corresponding to the curved center line L2 is better than the local deformation resistance of the filling part 1021e, so as to better absorb the impact stress at the curved center line L2.

Optionally, part of the plurality of second hollow portions H2 may extend from the second bending portion 101b to the first flexible display portion 101a, which will not be repeated herein for brevity.

Figure 5F:
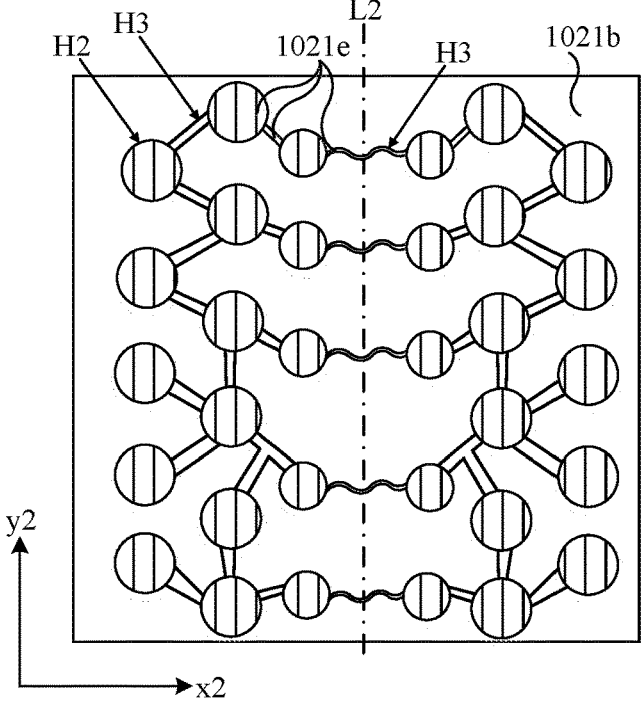

Optionally, the second support portion 1021b further includes a third hollow portion H3, as shown in FIG. 5F. The third hollow portion H3 connects any two of the second hollow portions H2, and the filling part 1021e may be located in the third hollow portion H3, so that when the second bending portion 101b of the display panel is subjected to an impact, the second support portion 1021b, the filling part 1021e located the third hollow portion H3, and the filling part 1021e located in the second hollow portion H2 disperse the impact force, reduce the force per unit area, and further improve the resistance against impact deformation of the second bending portion 101b.

Still referring to FIG. 3A to FIG. 3D, the support member 102 is provided with an opening penetrating through the first support portion 1021a, and the second support portion 1021b is located in the opening, so that the first support portion 1021a and the second support portion 1021b jointly support the display panel.

Further, the material of the second support portion 1021b includes foam material. Compared with the foam material with a large compression force deflection (CFD) (that is, a response force to an applied object after the foam is compressed to a certain proportion and reaches a mechanical equilibrium), the foam material with a small CFD is softer. The compression force deflection (CFD) is proportional to a compression ratio K. Therefore, in order to make the second support portion 1021b have better buffering performance, the compression ratio of the second support portion 1021b should not exceed 20%. In addition, the compression ratio (K) is defined as K=100%*(h0–h1)/h0, wherein h0 represents a thickness of the foam material before compression, and h1 represents a thickness of the foam material after compression. It can be seen that the compression ratio K is inversely proportional to the thickness h0 of the foam material before compression, that is, the larger the h0, the smaller the K, the smaller the CFD, and the softer the material of the foam material. Therefore, the second support portion 1021b can be set to have a thickness greater than or equal to the thickness of the first support portion 1021a, so that the second support portion 1021b can absorb stress when the display panel is squeezed or impacted. Optionally, the thickness of the second support portion 1021b is 1 to 1.2 times the thickness of the first support portion 1021a.

Optionally, the thickness of the first support portion 1021a is greater than or equal to 50 microns and less than or equal to 150 microns, and the thickness of the second support portion 1021b is greater than or equal to 50 microns and less than or equal to 180 microns.

Still referring to FIG. 1A to 1C and FIG. 3A to FIG. 3D, the support member 102 further includes a connecting layer, and the connecting layer is located between the support layer 1021 and the panel body 101.

Optionally, the first support portion 1021a may adopt a single-layered design, that is, the support layer 1021 as shown in FIG. 3A to FIG. 3B includes a first support portion 1021a. The first support portion 1021a may also adopt a multi-layered design, that is, both the connecting layer and the support layer 1021 as shown in FIG. 3C to FIG. 3D include the first support portion 1021a. Referring to FIG. 3C to FIG. 3D, the support member 102 is provided with an opening penetrating through the support layer 1021 and the connecting layer, and the second support portion 1021b is located in the opening. Further, in order to make the second support portion 1021b have better buffering performance, the compression ratio of the second support portion 1021b is not more than 20%, and the thickness of the second support portion 1021b is greater than or equal to a sum of the thickness of the first support portion 1021a and the thickness of the connecting layer.

Optionally, the thickness of the second support portion 1021b is 1 to 1.2 times the sum of the thickness of the first support portion 1021a and the thickness of the connecting layer.

Optionally, the connecting layer includes a first connecting layer 1022 and a second connecting layer 1023. The first connecting layer 1022 is located between the second connecting layer 1023 and the support layer 1021, and the second connecting layer 1023 is located between the first connecting layer 1022 and the panel body 101. Further, the hardness of the first connecting layer 1022 is less than the hardness of the second support portion 1021b. Optionally, the material of the first connecting layer 1022 has a compression load at 25% in the range of 0.2 MPa or less, and the material of the second support portion 1021b has a compression load at 25% in the range of 0.5 MPa to 1 MPa. Optionally, the materials of the second connecting layer 1023 and the support layer 1021 are different from the materials of the first connecting layer 1022. Specifically, the materials of the first connecting layer 1022 and the second support portion 1021b include foam materials with different hardness. Further, the foam materials include polyethylene foam (such as PE foam, EVA foam, etc.), rubber foam (such as CR foam, EPDM foam, etc.), and so on.

Optionally, the opening may partially penetrate the connecting layer, or may completely penetrate through the connecting layer. Specifically, when the opening portion penetrates the connecting layer, the opening may only penetrate through the first connecting layer 1022. In such a case, in order to ensure that the compression ratio of the second support portion 1021b does not exceed 20%, the thickness of the second support portion 1021b is 1 to 1.2 times the sum of the thickness of the first support portion 1021a and the thickness of the first connecting layer 1022. Optionally, the thickness of the first support portion 1021a is greater than or equal to 50 microns and less than or equal to 150 microns, and the thickness of the first connecting layer 1022 is greater than or equal to 50 microns and less than or equal to 100 microns, while the thickness of the second support portion 1021b is greater than or equal to 100 micrometers and less than or equal to 300 micrometers.

Similarly, when the openings completely penetrate through the connecting layer, in order to ensure that the compression ratio of the second support portion 1021b does not exceed 20%, the thickness of the second support portion 1021b is 1 to 1.2 times the sum of the thickness of the first support portion 1021a, the thickness of the first connecting layer 1022, and the thickness of the second connecting layer 1023.

Optionally, the spacer portion 1021c may be arranged between the first connecting layer 1022, the first support portion 1021a, and the second support portion 1021b, as shown in FIG. 3D, so as to provide complete support through the second connecting layer 1023 and the second support portion 1021b, and reduce the impact of bending stress on the second support portion 1021b through the spacer portion 1021c.

Still referring to FIG. 1A to FIG. 1C, the panel body 101 further includes a third display portion 101c, and the second bending portion 101b is located between the first flexible display portion 101a and the third display portion 101c. The third display portion 101c is disposed opposite to the first flexible display portion 101a, and the first support portion 1021a supports the side of the first flexible display portion 101a and the side of the third display portion 101c close to the first flexible display portion 101a. The third display portion 101c opposite to the first flexible display portion 101a indicates that, in a top view, the third display portion 101c partially overlaps the first flexible display portion 101a, that is, when the second bending portion 101b is in a bending state, the third display portion 101c is bent to the bottom of the first flexible display portion 101a.

Further, opposite ends of the second support portion 1021b respectively support the side of the first flexible display portion 101a and the side of the third display portion 101c, so that the second support portion 1021b can improve the impact resistance of the second bending portion 101b while reducing the impact of impact force on the first flexible display portion 101a and the third display portion 101c.

Optionally, the display panel further includes a bonding portion. The bonding portion is located at an end of the third display portion 101c away from the second bending portion 101b. The bonding portion of the display panel includes devices such as driving chips and circuit boards for making the display panel emit light.

Optionally, the display panel may include a plurality of the second bending portions 101b, as shown in FIG. 1C. In addition, the display panel further includes a fourth display portion 101d. The fourth display portion 101d is located between adjacent ones of the second bending portions 101b. The fourth display portion 101d may include a curved portion 1011a, and the fourth display portion 101d may also be a display portion kept in a straight state. In a top view, the second bending portion 101b and the fourth display portion 101d are both close to the bottom side of the display panel, and the second support portion 1021b can be disposed corresponding to the second bending portion 101b and the fourth display portion 101d.

Still referring to FIG. 1A to 1C, the display panel further includes a polarizer 103, an optical glue 104, a packaging cover 105, and the like on the panel body 101. Optionally, the packaging cover 105 includes a transparent polyimide film or ultra-thin glass. The display panel further includes other parts not shown, such as sensor touch electrodes, color filters, sensors, and so on. Further, the display panel further includes a middle frame 106 and the like that carry the panel body 101.

The present disclosure also provides a display device including any of the above-mentioned display panels.

The above is a detailed introduction to a display panel and a display device provided by the embodiments of the present disclosure. Specific examples are used in this article to illustrate the principles and implementations of the present disclosure. The descriptions of the above embodiments are only used to help understand the present disclosure. At the same time, for those skilled in the art, according to the idea of the present disclosure, there will be changes in the specific implementation and the scope of application. In summary, the content of this specification should not be construed as a reference to the present disclosure restrictions.

What is claimed is:

1. A display panel, comprising:
   a panel body comprising a first flexible display portion and a second bending portion located at an end of the first flexible display portion; and
   a support member comprising a support layer, wherein the support layer comprises a first support portion and a second support portion, the first support portion supports a side of the first flexible display portion, and the second support portion is in a bent state and supports a side of the second bending portion,
   wherein a stress buffering capacity of the first support portion is less than a stress buffering capacity of the second support portion;
   wherein the support member further comprises a connecting layer between the support layer and the panel body; the support member is provided with an opening penetrating through the support layer and the connecting layer, and the second support portion is disposed in the opening.

2. The display panel according to claim 1, wherein an elastic modulus of the first support portion is greater than an elastic modulus of the second support portion.

3. The display panel according to claim 1, wherein a material of the first support portion comprises a stainless steel plate, and a material of the second support portion comprises foam.

4. The display panel according to claim 1, wherein the first support portion and the second support portion are spaced apart from each other.

5. The display panel according to claim 1, wherein the first support portion and the second support portion are connected to each other.

6. The display panel according to claim 1, wherein the support member is provided with an opening penetrating through the first support portion, and the second support portion is disposed in the opening.

7. The display panel according to claim 6, wherein a thickness of the second support portion is greater than or equal to a thickness of the first support portion.

8. The display panel according to claim 7, wherein the thickness of the second support portion is 1 to 1.2 times the thickness of the first support portion.

9. The display panel according to claim 1, wherein the connecting layer comprises a first connecting layer and a second connecting layer, the first connecting layer is located between the second connecting layer and the support layer, and the second connecting layer is located between the first connecting layer and the panel body.

10. The display panel according to claim 1, wherein a thickness of the second support portion is 1 to 1.2 times a sum of a thickness of the first support portion and a thickness of the connecting layer.

11. The display panel according to claim 1, wherein when the first flexible display portion is in a bent state, the first flexible display portion comprises a curved portion, and a bending direction of the curved portion is different from a bending direction of the second bending portion.

12. The display panel according to claim 1, wherein the panel body further comprises a third display portion, the second bending portion is located between the first flexible display portion and the third display portion, the third display portion is opposite to the first flexible display portion, and the first support portion supports the side of the first flexible display portion and a side of the third display portion close to the first flexible display portion.

13. The display panel according to claim 12, wherein opposite ends of the second support portion supports the side of the first flexible display portion and the side of the third display portion, respectively.

14. The display panel according to claim 1, wherein the first support portion comprises a plurality of first hollow portions and the second support portion comprises a plurality of second hollow portions, and in a unit area, a density of hollow holes of the first hollow portions and a density of hollow holes of the second hollow portions are different.

15. The display panel according to claim 14, wherein the support layer further comprises a filling part disposed in the second hollow portions, and a hardness of the second support portion is less than a hardness of the filling part.

16. A display device, comprising a display panel, the display panel comprising:

a panel body comprising a first flexible display portion and a second bending portion located at an end of the first flexible display portion; and a support member comprising a support layer, wherein the support layer comprises a first support portion and a second support portion, the first support portion supports a side of the first flexible display portion, and the second support portion is in a bent state and supports a side of the second bending portion, wherein a stress buffering capacity of the first support portion is less than a stress buffering capacity of the second support portion;

wherein the support member further comprises a connecting layer between the support layer and the panel body; the support member is provided with an opening penetrating through the support layer and the connecting layer, and the second support portion is disposed in the opening.

17. The display device according to claim 16, wherein an elastic modulus of the first support portion is greater than an elastic modulus of the second support portion.

18. The display device according to claim 16, wherein the support member is provided with an opening penetrating through the first support portion, and the second support portion is disposed in the opening.

\* \* \* \* \*